(12) United States Patent
Kong et al.

(10) Patent No.: US 9,941,258 B2
(45) Date of Patent: Apr. 10, 2018

(54) LED LEAD FRAME ARRAY FOR GENERAL ILLUMINATION

(71) Applicant: GE Lighting Solutions, LLC, East Cleveland, OH (US)

(72) Inventors: Ming Kong, Boulder, CO (US); Jeffrey Bisberg, Boulder, CO (US); John Powell, Boulder, CO (US)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 436 days.

(21) Appl. No.: 14/572,911

(22) Filed: Dec. 17, 2014

(65) Prior Publication Data
US 2016/0178133 A1   Jun. 23, 2016

(51) Int. Cl.

| H01L 25/075 | (2006.01) |
|---|---|
| F21K 9/232 | (2016.01) |
| F21S 4/22 | (2016.01) |
| F21V 29/70 | (2015.01) |
| F21V 3/02 | (2006.01) |
| F21V 29/87 | (2015.01) |
| F21Y 103/10 | (2016.01) |
| F21Y 115/10 | (2016.01) |

(52) U.S. Cl.
CPC ............ *H01L 25/075* (2013.01); *F21K 9/232* (2016.08); *F21S 4/22* (2016.01); *F21V 3/02* (2013.01); *F21V 29/70* (2015.01); *F21V 29/87* (2015.01); *F21Y 2103/10* (2016.08); *F21Y 2115/10* (2016.08); *H01L 2924/0002* (2013.01)

(58) Field of Classification Search
CPC .. F21K 9/232; F21Y 2115/10; F21Y 2103/30; F21Y 2103/10; H01L 25/00; H01L 33/00; F21S 4/00; F21S 4/22
See application file for complete search history.

(56) References Cited

U.S. PATENT DOCUMENTS

| 7,513,653 | B1* | 4/2009 | Liu | F21V 29/004 362/218 |
|---|---|---|---|---|
| 2003/0063463 | A1* | 4/2003 | Sloan | F21V 21/0808 362/238 |
| 2007/0063213 | A1* | 3/2007 | Hsieh | H01L 25/0753 257/99 |
| 2009/0072251 | A1* | 3/2009 | Chan | H01L 25/0753 257/89 |
| 2009/0086482 | A1* | 4/2009 | Wilm | F21K 9/00 362/235 |
| 2010/0149806 | A1* | 6/2010 | Yiu | F21K 9/00 362/249.02 |
| 2013/0010472 | A1* | 1/2013 | Li | F21V 29/2231 362/249.02 |
| 2013/0120979 | A1* | 5/2013 | Chen | F21V 21/005 362/217.17 |
| 2013/0242560 | A1* | 9/2013 | Hsu | F21V 19/001 362/249.06 |

(Continued)

*Primary Examiner* — Andrew Coughlin
*Assistant Examiner* — Christopher E Dunay
(74) *Attorney, Agent, or Firm* — Peter T. DiMauro; GE Global Patent Operation

(57) ABSTRACT

An LED lead frame assembly includes a circuit strip assembly, a plastic dam member overmolded onto the circuit strip assembly and a LED chip assembly disposed in a pocket of the plastic dam member. The LED chip assembly is electrically coupled to the circuit strip assembly to power the LED chip assembly.

17 Claims, 5 Drawing Sheets

(56) References Cited

U.S. PATENT DOCUMENTS

| | | | | |
|---|---|---|---|---|
| 2014/0313713 A1* | 10/2014 | Andrews | ............. | F21S 4/001 |
| | | | | 362/235 |
| 2015/0252956 A1* | 9/2015 | Carroll | ............. | F21K 9/90 |
| | | | | 362/249.04 |
| 2015/0323139 A1* | 11/2015 | Tseng | ............. | F21K 9/232 |
| | | | | 362/650 |
| 2015/0330584 A1* | 11/2015 | Bobbo | ............. | F21V 15/013 |
| | | | | 362/220 |
| 2015/0354797 A1* | 12/2015 | Luo | ............. | H05K 1/028 |
| | | | | 362/223 |
| 2016/0161090 A1* | 6/2016 | Yoon | ............. | C09K 11/025 |
| | | | | 252/301.6 P |

* cited by examiner

LED LEAD FRAME ARRAY FOR GENERAL ILLUMINATION

BACKGROUND

Field

The aspects of the present disclosure relate generally to an LED lead frame assembly, and more particularly to an LED lead frame assembly that is capable of being attached directly on a light fixture.

Description of Related Art

A light emitting diode (LED) is an electric light source constructed from semiconductor materials. An LED will generally include a lead frame and housing. The typical LED lead frame will have a pair of leads that are produced by stamping a metal sheet and then molding the LED lead frame within a plastic housing. An LED chip is bonded on one of the leads and wires are connected to the leads to establish the electrical connections.

The housing for the LED will generally include a cavity into which an LED chip is disposed and potted. Conductive leads or wires for providing power to the LED chip are mounted in the lead frame and connected to the LED chip.

General Solid State Lighting (SSL) applications typically require arrays of individual LED components to achieve sufficient light output. This is normally achieved by soldering individual LED components onto Printed Circuit Boards (PCB's) and then attaching the PCB's onto the lighting fixture.

Employing PCB's in SSL fixtures may pose certain disadvantages. For example, the costs associated with the PCB fabrication to form an LED light fixture can be high. Surface Mount Technology (SMT) processes to attach the LED components and the assembling of the PCB assembly onto the fixture adds cost and longer assembly or lead time to the manufacture of the overall light fixture.

Also, the high temperature of the SMT reflow process may accelerate aging and yellowing of the LED components. Compared to pure metal, PCB's have large thermal resistance (typically 2-5 K/W). This thermal resistance tends to impair thermal dissipation between the LED components and the fixture heat sink, resulting in reduced reliability of the LED's. While a PCB having a metal core will improve heat dissipation, a metal core PCB is an expensive alternative.

Accordingly, it would be desirable to provide an LED array for Solid State Lighting applications using a lead frame that addresses at least some of the problems identified above.

BRIEF DESCRIPTION OF THE DISCLOSED EMBODIMENTS

As described herein, the exemplary embodiments overcome one or more of the above or other disadvantages known in the art.

One aspect of the exemplary embodiments relates to an LED lead frame assembly. In one embodiment, the LED lead frame assembly includes a circuit strip assembly, a plastic dam member overmoulded onto the circuit strip assembly and a LED chip assembly disposed in a pocket of the plastic dam member. The LED chip assembly is potted with a light-transmissive (e.g., clear) encapsulate. The LED chip assembly is electrically coupled to the circuit strip assembly to power the LED chip assembly.

Another aspect of the exemplary embodiments relates to an LED light. In one embodiment, the LED light includes a lighting fixture and an LED lead frame array attached directly to the lighting fixture. The LED lead frame array includes one more LED modules, wherein an LED module includes a circuit strip assembly, a plastic dam member overmoulded onto the circuit strip assembly, and a LED chip assembly disposed in a pocket of the plastic dam member. The LED chip assembly is electrically coupled to the circuit strip assembly to power the LED chip assembly.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DETAILED DESCRIPTION OF THE DISCLOSED EMBODIMENTS

Figure 1:
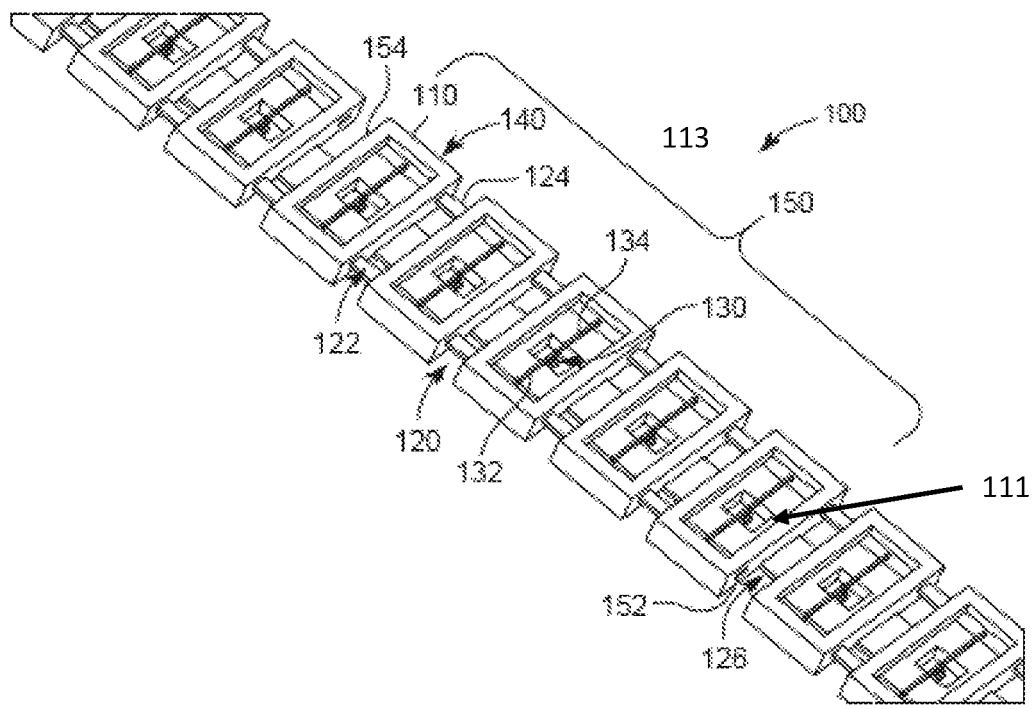
FIG. 1 illustrates top perspective view of an exemplary LED lead frame assembly incorporating aspects of the present disclosure.

Referring to FIG. 1, one embodiment of an LED lead frame assembly or array 100 incorporating aspects of the disclosed embodiments is illustrated. The aspects of the disclosed embodiments are generally directed to an LED lead frame assembly for general illumination that allows the LED component to be attached directly to a lighting fixture. The aspects of the present disclosure may advantageously eliminate the need to separately attach the LED components to a printed circuit board, where the printed circuit board is then attached to the lighting fixture. Rather, the LED lead frame assembly 100 is configured to be attached directly to the lighting fixture in a secure and thermally efficient manner.

As is shown in the example of FIG. 1, the LED lead frame assembly 100 generally comprises an array of LED modules 140. An LED module 140 generally comprises a plastic dam member assembly 110 and a circuit strip assembly 120. An LED chip assembly 130 is disposed in or on the plastic dam member assembly 110. The circuit strip assembly 120 provides conductive elements for coupling the LED chip assembly 120 to electrical power.

In the example shown in FIG. 1, the circuit strip assembly 120 includes conductive circuit leads 122, 124 and a heat dissipation strip or member 126. The LED chip assembly 130 includes conductive bonding wires 132, 134 that are used to electrically connect the LED chip assembly 130 to a suitable electrical power source. As is generally understood, light-transmissive material (optionally bearing phosphors) will be used to cover and protect the LED chip assembly 130. Although the example of FIG. 1 generally illustrates a linear LED lead frame assembly 100 or array structure, the aspects of the disclosed embodiments are not so limited. In alternate embodiments, the LED lead frame assembly 100 can comprise any suitable array structure, such as a two-dimensional array structure.

Figure 2:
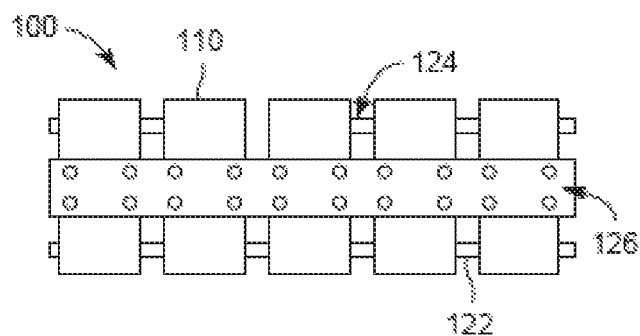
FIG. 2 illustrates a bottom side view of the LED lead frame assembly of FIG. 1.

FIG. 2 illustrates a bottom view of the LED lead frame assembly 100 shown in FIG. 1. In this example, the heat dissipation strip 126 is mounted to the bottom of respective ones of the plastic dam member 110. The heat dissipation strip 126 is configured to be thermally coupled to the LED chip assembly 130 and dissipate heat generated by the LED chip assembly 130. The LED lead frame assembly 100 is configured to be attached to a lighting fixture such that the heat dissipation strip 126 is thermally coupled or in contact with the lighting fixture. Examples of such a configuration will be described herein with reference to FIGS. 5-7.

Figure 3:
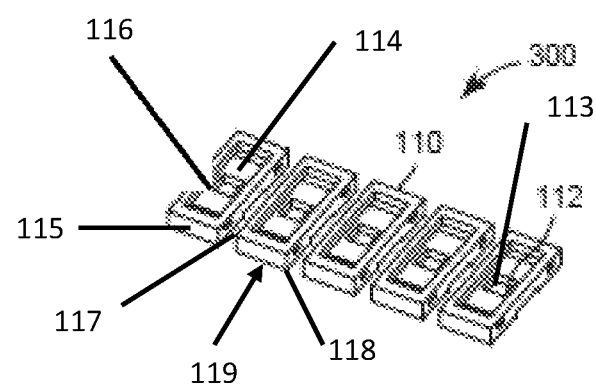
FIG. 3 illustrates an exemplary embodiment of a plastic dam member assembly for an LED lead frame assembly incorporating aspects of the present disclosure.

FIG. 3 illustrates one embodiment of an array 300 of plastic dam members 110 shown in FIG. 1. Each plastic dam member 110 includes a bottom member 114, side members 115, a first end 117 and a second end 118. The bottom member 114 includes a top surface 116 and a bottom surface 119. The pocket 112 has a bottom surface 113. In the embodiment where the heat dissipation member 126 forms the bottom of the pocket 112, there can be an opening 111 in the bottom of the pocket 112, as shown in FIG. 1. In this example, the array 300 comprises a modular array of plastic dam members 110. The plastic dam member 110 generally comprises a cast of a thermal-set (e.g., thermoset) plastic. Examples of materials for the plastic dam member 110 can include, but are not limited to a high performance polyamide or Polyphthalamide (PPA), a liquid crystal polymer (LCP) or a silicone. In alternate embodiments, any suitable material can be used for the plastic dam member 110.

As is shown in the examples of FIGS. 1 and 3, the plastic dam member 110 is configured to be overmolded about the conductive strips 122, 124. The plastic dam member 110 will also include a pocket or opening 112, also referred to as a recess or receiving section, which is configured to receive the LED chip assembly 130. In one embodiment, the die portion of the LED chip assembly 130 can be placed and potted in the pocket 112. A clear or phosphor bearing encapsulate can be used to pot the die portion of the LED in the pocket 112. In alternate embodiments, any suitable material can be used to pot the die portion of the LED in the pocket 112.

Figure 4:
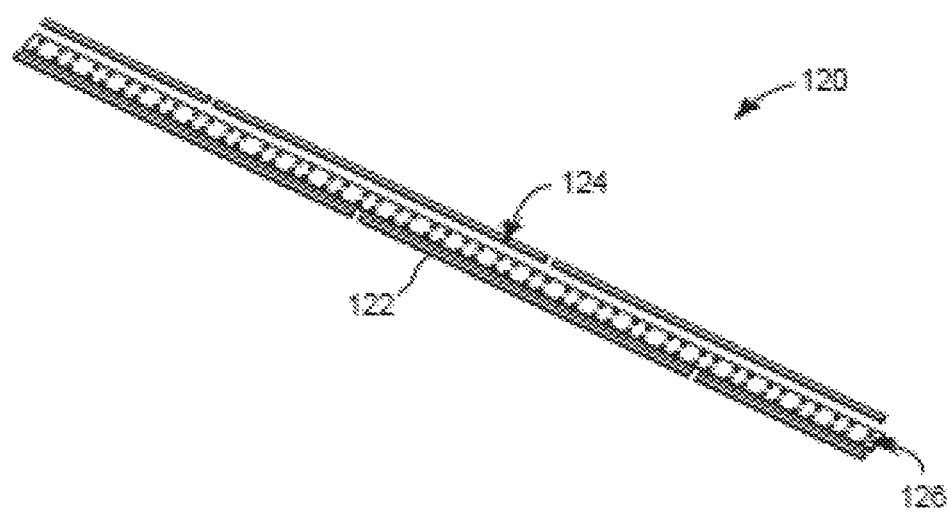
FIG. 4 illustrates a circuit strip assembly for an LED lead frame assembly incorporating aspects of the present disclosure.

Referring to FIG. 4, in one embodiment, the circuit strip assembly 120 generally comprises conductive strips or elements 122, 124 and a heat dissipation strip or member 126. In one embodiment, the circuit strips 122, 124 and heat dissipation strip 126 are punched or cut from a single sheet of conductive material, such as for example a metal lead frame. Examples of the conductive material of the circuit strip assembly 120 can include, but are not limited to, copper, fermium or an aluminium alloy. In alternate embodiments, any suitable electrically and thermally conductive material can be used for one or more of the circuit strips 122, 124 and heat dissipation strip 126. In the example of FIG. 4, the conductive strip elements 122, 124 are thinner and/or narrower than the heat dissipation strip 126.

As shown in FIG. 4, the conductive strips 122, 124 generally comprise an anode and cathode electrical bus strips, respectively. The particular configuration of the anode and cathode electrical bus strips will depend upon the particular configuration. The anode and cathode electrical bus strips are used to power the LED chip assembly 130. In one embodiment, the conductive strips 122, 124 are electrically coupled to respective ones of the bonding wires 132, 134 of the LED chip assembly 130.

The heat dissipation strip 126 is generally configured to remove heat from the LED chip assembly 130. In the example of FIGS. 2-4, the heat dissipation strip 126 is generally located centrally relative to the plastic dam member 110 and LED chip assembly 130. In one embodiment, also referring to FIGS. 2-4, the electrically conducting strips or members 122, 124 are disposed on a first plane relative to the plastic dam member 110 and the heat dissipation member 126 is disposed on a second plane relative to the plastic dam member 110. In these examples, the first plane is in a different plane than the second plane; for example, the first plane may be above the second plane.

As is shown in the example of FIG. 1, the plastic dam 110 is overmolded about the conductive strips 122, 124 to electrically isolate the conductive strips 122, 124 from one another. The LED chip assembly 130 is thermally coupled to the heat dissipation strip 126 within the pocket 112 and wire bonded to respective ones of the conductive strips 122, 124, depending upon the particular application. In the example shown in FIG. 1, the conductive strip 122 is electrically coupled to bonding wire 132, while conductive strip 124 is electrically coupled to bonding wire 134.

Referring again to FIG. 1, the LED module 140 is formed by an encapsulation process, as is generally described above. The encapsulation processes used herein can be the same or similar to those used in standard LED packaging processes. However, the LED module 140 described is not separated into individual LED packages or coupled to a printed circuit board. Rather, an electrical circuit is created by orientating the LED chip assembly 130 and wire bonds 134, and selectively cutting the bus strips 122, 124 between adjacent LED modules 140. In this fashion, the basic LED lead frame assembly 100 can be configured to realize a variety of circuit configurations with LED die assemblies 130, in parallel and/or series configurations.

In one embodiment, electrical connectors can be incorporated during lead frame fabrication at appropriate intervals along the lead frame assembly 100. The direct fabrication of connectors within the lead frame assembly 100 facilitates electrically connecting the lead frame assembly 100 to the fixture wiring harness. As an example, referring to FIG. 1, a segment 150 of LED modules 140 can comprise five LED modules 140. Connection points 152 and 154 can be used to couple the segment 150 to electrical power. In alternate embodiments, the segment 150 can comprise any suitable number of LED modules 140, including more or less than five.

Figure 5:
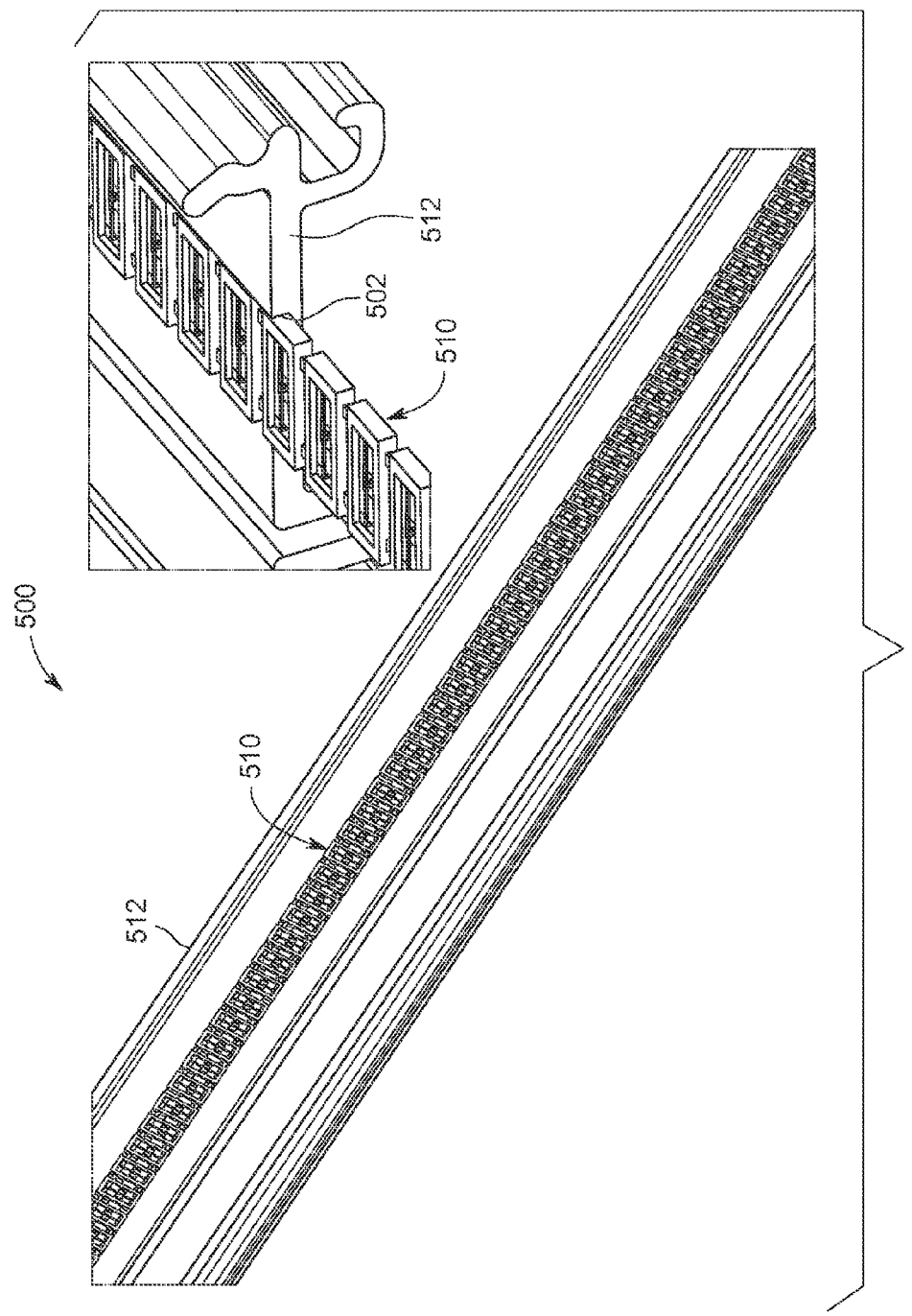
FIG. 5-7 illustrate exemplary applications of LED lead frame assemblies incorporating aspects of the present disclosure.
Figure 6:
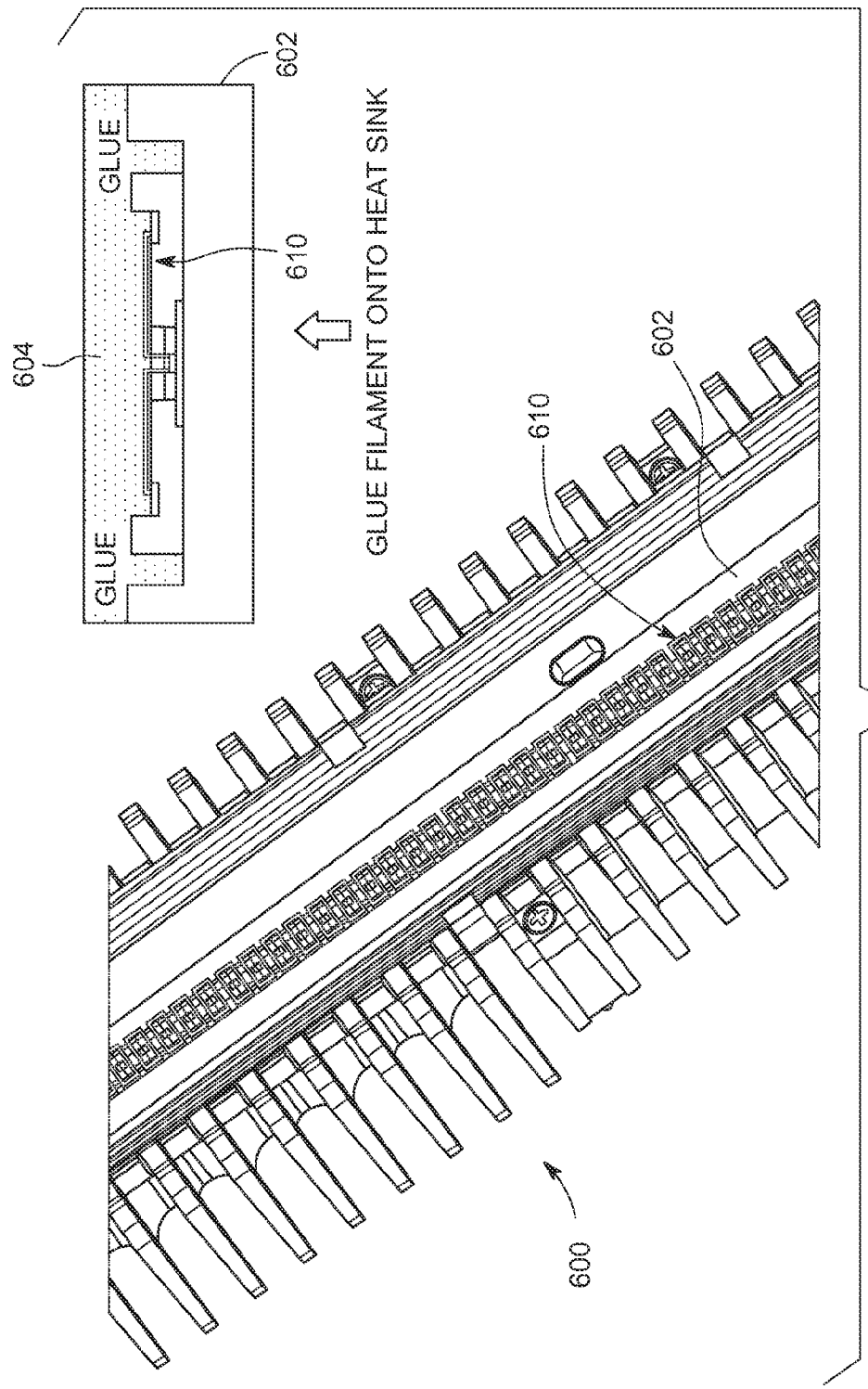
Figure 7:
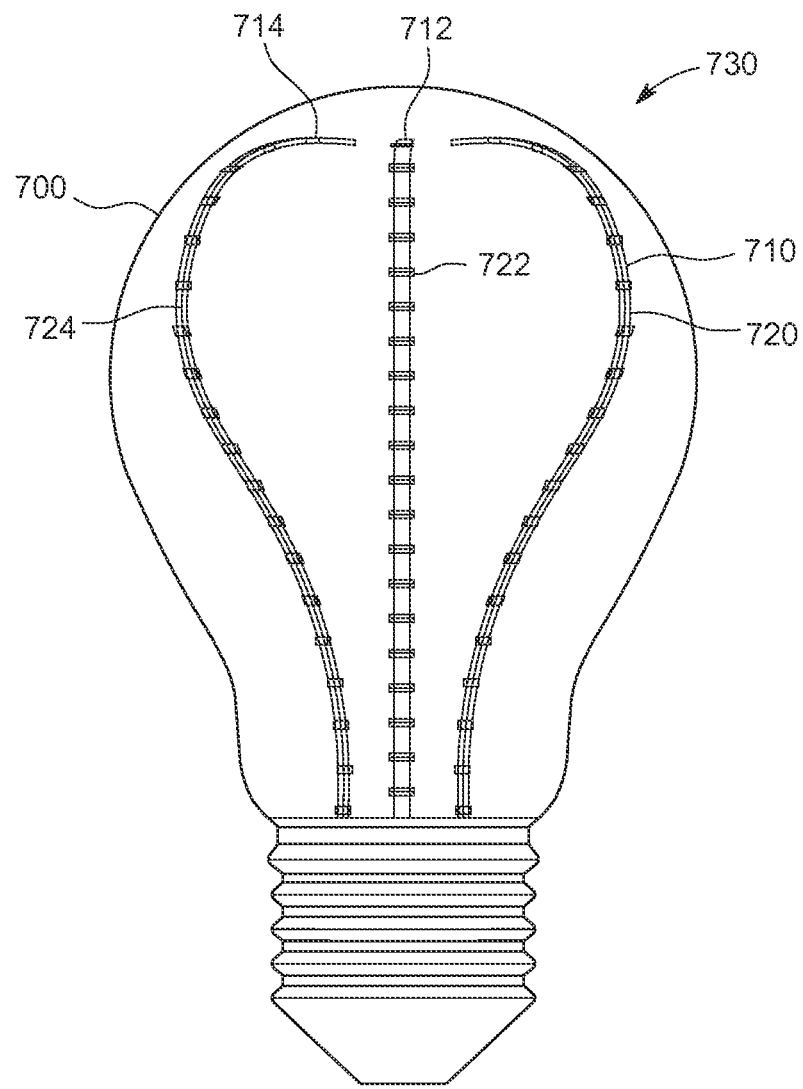

FIGS. 5-7 illustrate exemplary applications or configurations of the LED lead frame assembly 100 of the present disclosure. The LED lead frame assembly 100 shown in FIG. 1 is generally configured to be connected directly to a lighting fixture, without the need for an intermediary PCB. In one embodiment, the heat dissipation strip 126 is placed in contact with the lighting fixture. The more complete the interface of the heat dissipation strip 126 is against the lighting fixture surface, the better will be the thermal conduction across the interface. As with attaching a LED PCB assembly to a lighting fixture, the mounting of the LED lead frame assembly 100 to the lighting fixture will require a thermally conductive adhesive or a compressive load supplied by screws or a fixture component.

In one embodiment, since the LED chip assembly or die 130 is thermally coupled or attached to the heat dissipation strip 126, the attachment of the LED lead frame assembly 100 to the lighting fixture may require an additional dielectric layer to isolate the LED lead frame assembly 100 from the lighting fixture. This may be required even though the LED die thermal pad of the LED chip assembly 130 is not an electrical pad since the die substrate may not by itself provide adequate electrical insulation. A thermally conductive adhesive or tape would accomplish this requirement.

As is illustrated in the examples of FIGS. 5-7, the LED lead frame assembly 100 can be attached to the lighting fixture by one or more of sliding the LED lead frame assembly 100 into a channel in the lighting fixture or directly attaching or bonding the LED lead frame assembly 100 to the lighting fixture.

FIG. 5 illustrates an exemplary application of an LED lead frame array 500 incorporating aspects of the present disclosure. In this example, a linearly configured LED lead frame array or filament 510 is slid into a channel 502 of an extruded linear light fixture component 512. As shown in FIG. 5, the light fixture component 512 also referred to as an extrusion lid, includes a channel 502 that allows the LED filament 510, such as the LED lead frame assembly 100 shown in FIG. 1, to be slid into the channel 502 of the light fixture component 512. Prior applications may have required a printed circuit board to be inserted or otherwise disposed in the channel 502.

FIG. 6 illustrates another exemplary application for a LED lead frame array 600 incorporating aspects of the present disclosure. In this example, a linearly configured LED lead frame array or filament 610 is bonded to the heat sink portion 602 of the LED lead frame array 600, which in this example comprises a high bay fixture. In this example, the filament 610 can be glued onto the heat sink portion 602 of the high bay fixture 600 using a suitable thermal adhesive 604.

The LED lead frame assembly 100 of the present disclosure, as shown in FIG. 1, has a flexible and bendable design. The flexibility of the LED lead frame assembly 100 provides for the formation of different configurations of LED filaments. FIG. 7 illustrates one example of such a flexible and bendable configuration.

As is shown in FIG. 7, a light bulb 700 is formed that includes one or more LED filaments 710, 712, 714. The LED filaments 710, 712, 714 generally comprise LED lead frame assemblies such as the LED lead frame assembly 100 shown in FIG. 1. In this example, there are three such LED lead frame assemblies or LED filaments 710, 712, 714. As is shown in FIG. 7, the flexible nature of the LED filaments 710, 712, 714 allows the LED filaments 710, 712, 714 to be bent or formed to a desired orientation and configuration.

In the example of FIG. 7, the LED filaments 710, 712, 714 are bent and bonded to a respective curved heat sink 720, 722, and 724. The three curved heat sinks 720, 722, 724 with respective LED filaments 710, 712 and 714, bent and bonded thereto, form the filament 730 of the LED light bulb 700.

The aspects of the disclosed embodiments provide an LED lead frame assembly or component that is flexible in nature and can be attached directly to a light fixture. The LED lead frame assembly of the present disclosure is integrated directly into the lighting fixture, which may eliminate the need for a printed circuit board as the interface between the LED component and the lighting fixture. The electrical circuit requirements to link and power the LED lead frame assembly are carried out through the metal lead frame. This can reduce the overall fixture cost as well as increase performance and reliability.

In addition, the aspects of the disclosed embodiments utilize conventional LED packaging technologies. Thus, many of the packaging aspects employed to improve the LED component performance, such as reflective surfaces and lens formation, can be maintained.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An LED lead frame assembly, comprising:
a circuit strip assembly;
a plastic dam member configured to be overmoulded onto the circuit strip assembly, the plastic dam member including side members and a bottom member;
a pocket formed in a top surface of the bottom member; and
a LED chip assembly disposed in the pocket, wherein the LED chip assembly is electrically coupled to the circuit strip assembly to power the LED chip assembly,
wherein the circuit strip assembly comprises a first conducting member, a second conducting member and a heat dissipation member, the first conducting member and the second conducting member configured to be connected to respective power connections of the LED chip assembly, the first conducting member having a first end and a second end, and the second conducting member having a first end and a second end, the first end of the first conducting member and the first end of the second conducting member configured to be connected to respective conducting members of a first adjacent LED lead frame assembly, and the second end of the first conducting member and the second end of the second conducting member are configured to be connected to respective conducting members of a second adjacent LED lead frame assembly, the first adjacent LED frame assembly being on an opposite side the LED lead frame assembly from the second adjacent LED frame assembly,
wherein the first conducting member, second conducting member, and the heat dissipation member extend completely through the plastic dam member of the first adjacent LED frame assembly and the second adjacent LED frame assembly.

2. The LED lead frame assembly of claim 1, wherein the circuit strip assembly comprises a pair of electrically conducting members and a heat dissipation member, the LED chip assembly being electrically coupled to the electrically conducting members and thermally coupled to the heat dissipation member.

3. The LED lead frame assembly of claim 2, wherein the plastic dam member electrically isolates the pair of electrically conducting members.

4. The LED lead frame assembly of claim 2, wherein the electrically conducting members are disposed on a first plane within the plastic dam member and a top surface of the heat dissipation member is disposed on a second plane underneath the plastic dam member, wherein the first plane is in a different plane than the second plane.

5. The LED lead frame assembly of claim 2, wherein the heat dissipation member is thermally coupled to a bottom of the plastic dam member below the pocket.

6. The LED lead frame assembly of claim 2, wherein a bottom of the pocket of the plastic dam member includes an opening, and a top surface of the heat dissipation strip is disposed in the opening.

7. The LED lead frame assembly of claim 1, wherein the plastic dam member comprises a thermal-set plastic.

8. The LED lead frame assembly of claim 1, further comprising a heat dissipation member connected to a bottom of the plastic dam member, the heat dissipation member further configured to be connected to a bottom of the first adjacent LED lead frame assembly and a bottom of the second adjacent LED lead frame array assembly.

9. The LED frame assembly according to claim 1, further comprising a heat dissipation member disposed along an outer surface of the bottom member of the plastic dam member and below the pocket.

10. The LED frame assembly according to claim 9 wherein the pocket includes a bottom portion, side portions and an open top, the bottom portion being thermally coupled to the heat dissipation member.

11. The LED frame assembly according to claim 1, further comprising a heat dissipation member, wherein the plastic dam member is disposed on top of the heat dissipation member and the LED chip assembly is thermally coupled to the heat dissipation member.

12. The LED frame assembly according to claim 1, wherein the circuit strip assembly comprises an anode conductor disposed on one side of the plastic dam member and a cathode conductor disposed on an opposite side of the plastic dam member, the anode conductor extending out of a first end and a second end of the plastic dam member on the one side and the cathode conductor extending out of the first end and the second end of the plastic dam on the other side.

13. A LED light, comprising:
a lighting fixture; and
an LED lead frame array attached directly to the lighting fixture, wherein the LED lead frame array comprises one more LED modules, wherein an LED module comprises:
a circuit strip assembly;
a plastic dam member configured to be overmoulded onto the circuit strip assembly, the plastic dam member including side members and a bottom member, the plastic dam member including a pocket formed in a top surface of the bottom member; and
a LED chip assembly disposed in the pocket of the plastic dam member, wherein the LED chip assembly is electrically coupled to the circuit strip assembly to power the LED chip assembly,
wherein the circuit strip assembly comprises: an anode conductor disposed on one side of the plastic dam member; a cathode conductor disposed on an opposite side of the plastic dam member, the anode conductor extending out of a first end and a second end of the plastic dam member on the one side and the cathode conductor extending out of the first end and the second end of the plastic dam on the other side; and wherein: the cathode conductor extending out of the first end is configured to be electrically connected to a cathode conductor of a first adjacent LED module; the cathode conductor extending out of the second end is configured to be electrically connected to a cathode conductor of a second adjacent LED module; the anode conductor extending out of the first end is configured to be electrically connected to an anode conductor of the first adjacent LED module; and the anode conductor extending out of the second end is configured to be electrically connected to an anode conductor of the second adjacent LED module,
wherein the circuit strip assembly further comprises a heat dissipation member between the anode conductor and the cathode conductor,
wherein the anode conductor, the cathode conductor, and the heat dissipation member extend completely through the plastic dam member of the first adjacent LED module and the second adjacent LED module.

14. The LED light of claim 13, wherein the circuit strip assembly comprises a pair of electrically conducting members and a heat dissipation member disposed underneath the bottom member of the plastic dam member, the LED chip assembly being electrically coupled to the electrically conducting members and thermally coupled to the heat dissipation member.

15. The LED light of claim 13, wherein the lighting fixture comprises a heat sink and the LED lead frame array is attached to the heat sink.

16. The LED light of claim 13, wherein the lighting fixture includes a channel, the channel being configured to receive the LED lead frame array.

17. The LED light according to claim 13, further comprising a heat dissipation member, wherein the plastic dam member of the LED module is disposed on top of the heat dissipation member and the LED chip assembly of the LED module is thermally coupled to the heat dissipation member; and
wherein the heat dissipation member is configured to be disposed along and connected to a bottom of each plastic dam member, and thermally coupled to a bottom of the one or LED modules, in the LED frame array.

* * * * *